United States Patent
Inaba et al.

(10) Patent No.: US 11,181,066 B2
(45) Date of Patent: Nov. 23, 2021

(54) INJECTION CONTROLLER

(71) Applicant: DENSO CORPORATION, Kariya (JP)

(72) Inventors: Masashi Inaba, Kariya (JP); Hiroyuki Fukuda, Kariya (JP); Katsuya Minamijima, Kariya (JP)

(73) Assignee: DENSO CORPORATION, Kariya (JP)

(*) Notice: Subject to any disclaimer, the term of this patent is extended or adjusted under 35 U.S.C. 154(b) by 0 days.

(21) Appl. No.: 16/805,060

(22) Filed: Feb. 28, 2020

(65) Prior Publication Data
US 2020/0284214 A1 Sep. 10, 2020

(30) Foreign Application Priority Data

Mar. 7, 2019 (JP) .............................. JP2019-041574

(51) Int. Cl.
*F02D 41/26* (2006.01)
*F02M 51/06* (2006.01)
*G01R 31/00* (2006.01)
*F02D 41/30* (2006.01)

(52) U.S. Cl.
CPC ......... *F02D 41/26* (2013.01); *F02D 41/3005* (2013.01); *F02M 51/061* (2013.01); *G01R 31/007* (2013.01); *F02D 2200/06* (2013.01)

(58) Field of Classification Search
CPC ..... F02D 2041/2006; F02D 2041/2051; F02D 2041/2058; F02D 2200/06; F02D 41/20; F02D 41/26; F02D 41/3005; F02D 41/40; F02M 51/061
See application file for complete search history.

(56) References Cited

U.S. PATENT DOCUMENTS

| | | | | |
|---|---|---|---|---|
| 5,425,343 | A * | 6/1995 | Akaki | F02D 41/2096 |
| | | | | 123/490 |
| 10,450,995 | B2 * | 10/2019 | Kimura | F02D 41/402 |
| 2017/0306907 | A1 * | 10/2017 | Namuduri | H02K 33/16 |
| 2018/0209373 | A1 * | 7/2018 | Yoshiume | F02M 61/10 |

FOREIGN PATENT DOCUMENTS

JP 2016-033343 A 3/2016

* cited by examiner

*Primary Examiner* — Carl C Staubach
(74) *Attorney, Agent, or Firm* — Posz Law Group, PLC (57) ABSTRACT

An injection controller includes a control IC outputting an energization instruction signal to apply a peak current to a fuel injection valve (i.e., an instruction TQ), and a current monitor unit detecting an electric current flowing in the fuel injection valve. The control IC corrects an output OFF time of the energization instruction signal based on a difference between (i) an integrated current of an ideal current profile which serves as a target current before reaching the peak current and (ii) an integrated current of an energization current in the fuel injection valve detected by the current monitor unit (i.e., an effective TQ).

16 Claims, 9 Drawing Sheets

INJECTION CONTROLLER

CROSS REFERENCE TO RELATED APPLICATION

The present application is based on and claims the benefit of priority of Japanese Patent Application No. 2019-041574, filed on Mar. 7, 2019, the disclosure of which is incorporated herein by reference.

TECHNICAL FIELD

The present disclosure generally relates to an injection controller that controls opening and closing of a fuel injection valve.

BACKGROUND INFORMATION

In the related art, the injection controller is used to inject fuel into an internal combustion engine by opening and closing a fuel injection. The injection controller performs valve opening control by supplying electric current to (i.e., energizing) a fuel injection valve that is electrically driven. In recent years, an ideal current profile of an energization current based on an instructed injection amount has been determined, and the injection controller performs valve opening control by applying an electric current to the fuel injection valve based on the ideal current profile.

If a gradient of the energization current of the fuel injection valve is lower than the ideal current profile due to various factors such as ambient temperature environment and/or aging deterioration, the actual injection amount may be greatly decreased from the instructed injection amount, thereby causing deterioration of an air-fuel ratio value (AF) and/or misfire.

In order to prevent these problems, it may be desirable to adjust (i.e., extend) an energization instruction time instructed to the fuel injection valve in advance in consideration of variations (e.g., difference among individual injection valves). However, if the energization instruction time is extended, i.e., is made longer, there may also be a risk of fuel mileage deterioration.

SUMMARY

It is an object of the present disclosure to provide an injection controller that is capable of providing counter measures for deterioration of an A/F value and/or misfire without pre-adjustment of an energization instruction time for taking variations of individual fuel injection valves into account and without compromising fuel mileage.

DESCRIPTION OF EMBODIMENTS

Hereinafter, the embodiments of the present disclosure will be described with reference to the attached drawings.

In each embodiment, portions corresponding to the contents described in the preceding embodiments are denoted by the same reference numerals, and redundant explanation may be omitted.

First Embodiment

Figure 1:
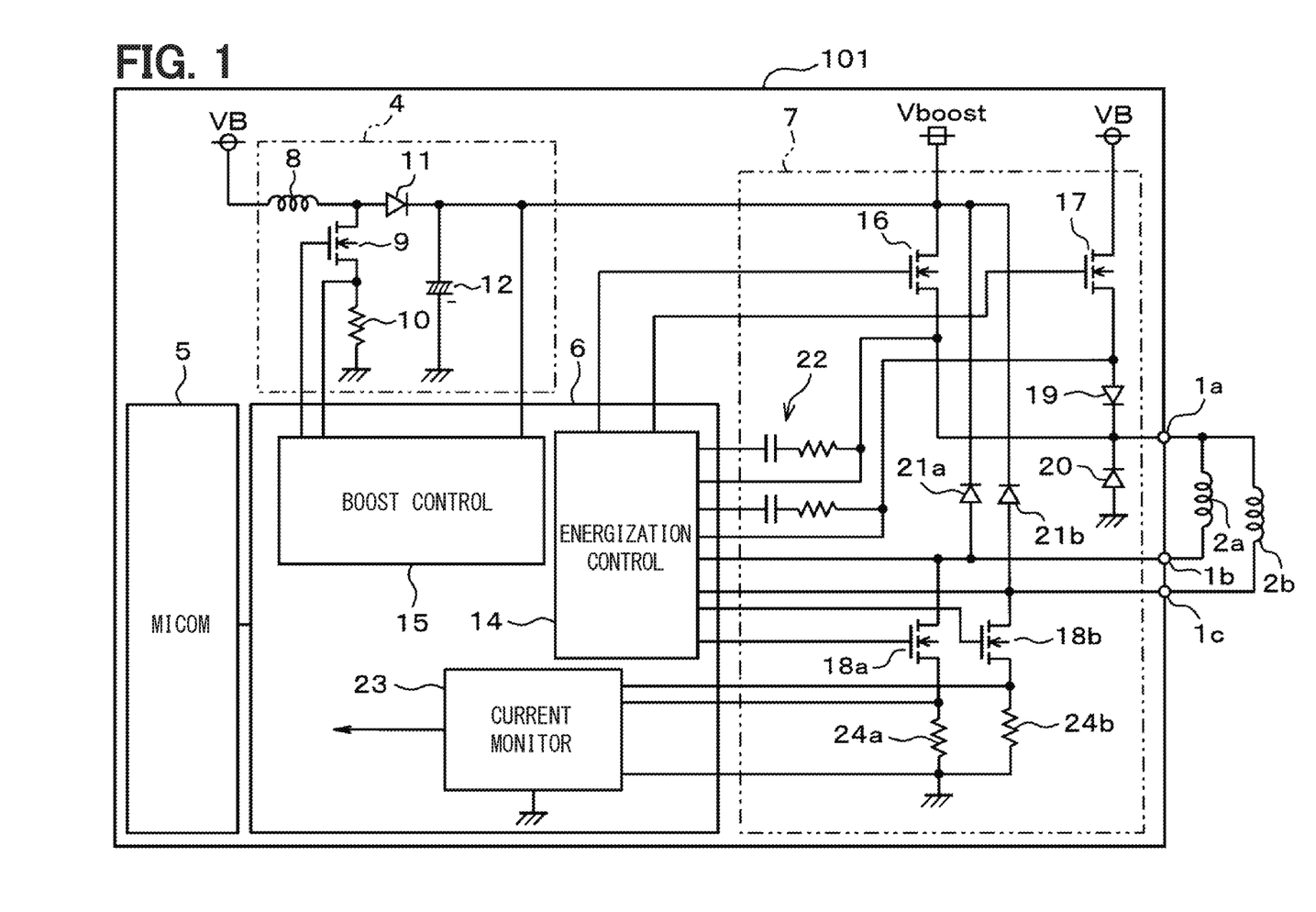
FIG. 1 is an electrical configuration diagram of an injection controller in a first embodiment of the present disclosure.

FIGS. 1 to 3B are explanatory diagrams of the first embodiment of the present disclosure. As shown in FIG. 1, an electronic control unit (ECU) 101 is a device for driving (i.e., a driver of) solenoid-type fuel injection valves 2a and 2b (i.e., may also be referred to as an injector) that injects fuel into an internal combustion engine mounted on a vehicle such as an automobile. Here, a configuration exemplifies an ECU 101 for two cylinders, but the present disclosure can also be applied to an engine with additional cylinders (e.g. four or six cylinders, etc).

The electronic control unit 101 includes a booster circuit 4, a microcomputer (i.e., MICOM in the drawing) 5 that outputs an injection instruction signal, a control IC 6, and a drive circuit 7 in the illustrated form. The booster circuit 4 is constituted by a DCDC converter using a voltage-boosting chopper circuit including an inductor 8, a MOS transistor 9 as a switching element, an electric current detection resistor 10, a diode 11, and a boost capacitor 12, for example. The configuration of the booster circuit 4 is not limited to the one shown in FIG. 1, but various forms of modification can be applied.

The microcomputer 5 includes a CPU, a ROM, a RAM, an I/O, and the like (not shown), and performs various processing operations based on programs stored in the ROM. The microcomputer 5 calculates an injection instruction timing based on a sensor signal from a sensor (not shown) outside of the microcomputer 5, and outputs an injection instruction signal for fuel injection to the control IC 6 at the injection instruction timing.

The control IC 6 as a control unit is, for example, an integrated circuit device such as ab ASIC, made up from a controller such as a logic circuit or a CPU, a storage unit such as a RAM, a ROM, or an EEPROM (none of which are shown in the drawing), a comparison unit using a comparator and the like, and configured to perform various controls based on hardware and software. The microcomputer 5 and the control IC 6 may be integrated to have a single body. In the present embodiment, in particular, it is helpful to speed up arithmetic processing. Therefore, a configuration in which the microcomputer 5 integrates the functions of the control IC 6 and includes a data flow processor (DFP) may be adopted. In the present embodiment, the configuration is described as the one in which the microcomputer 5 and the control IC 6 have separate bodies. The control IC 6 provides functions of an energization control unit 14, a boost control unit 15 as a boost voltage detection unit, and an electric current monitor unit 23 as an electric current detection unit. The control IC 6 functions as a reach time detection unit, a peak current estimation unit, and a boost voltage detection unit. Although the control IC 6 has other functions other than the above, illustration and description of the other functions are omitted.

The boost control unit 15 is a functional block for controlling a voltage boost operation of the booster circuit 4, by, for example, detecting a voltage between an anode of the boost capacitor 12 and a ground, detecting the electric current flowing through the current detection resistor 10, and controlling ON/OFF of the MOS transistor 9. The boost control unit 15 performs ON/OFF switching control of the MOS transistor 9 to rectify an energy accumulated in the inductor 8 through the diode 11, and gradually accumulates the energy in the boost capacitor 12. Thereby, the boost capacitor 12 holds a boost voltage Vboost higher than a power supply voltage VB.

The boost control unit 15 watches the boost voltage Vboost by monitoring the voltage between the anode of the boost capacitor 12 and the ground, and starts a boost control when the boost voltage Vboost reaches (i.e., falls below) a predetermined boost start voltage Vsta, and performs a boost control to boost the boost voltage Vboost to a boost completion voltage Vfu that is set for the boost voltage Vboost to exceed the boost start voltage Vsta. Thus, during a normal operation, the boost control unit 15 can output the boost voltage Vboost while controlling the boost voltage Vboost to the boost completion voltage Vfu. The boost completion voltage Vfu of the boost voltage Vboost is usually about 65V.

The current monitor unit 23 is provided at a position between cylinder selection switches 18a and 18b and the ground, and is a functional block that monitors an electric current flowing in the fuel injection valves 2a, 2b from current detection resistors 24a, 24b by using a comparison unit implemented as a comparator, an A/D converter and the like (not illustrated).

A voltage monitor (not shown) is provided for detecting a voltage between the fuel injection valves 2a, 2b and the cylinder selection switches 18a, 18b. The energization control unit 14 is a functional block for energizing and controlling the current to open and close the fuel injection valves 2a and 2b, which detects the voltage of output terminals 1b and 1c by using the voltage monitor, and performs ON/OFF control of a discharge switch 16, a constant current switch 17, and the cylinder selection switches 18a and 18b based on the current detected by the current monitor unit 23.

The drive circuit 7 includes, as primary parts, the discharge switch 16 as an upstream switch for discharging to turn ON and OFF the boost voltage Vboost to the fuel injection valves 2a and 2b, the constant current switch 17 as an upstream switch for a constant current control using the power supply voltage VB, and the cylinder selection switches 18a and 18b as downstream switches for cylinder selection respectively provided for each of the fuel injection valves 2a and 2b. The drive circuit 7 is configured to have connection to other peripheral circuits, such as, for example, diodes 19, 20, 21a, 21b, a bootstrap circuit 22, and the current detection resistors 24a, 24b in the illustrated form.

The discharge switch 16, the constant current switch 17, and the cylinder selection switches 18a and 18b are configured by using, for example, n-channel MOS transistors. These switches 16, 17, 18a, and 18b may also be configured by using other types of transistors (for example, bipolar transistors). However, in the present embodiment, these switches 16, 17, 18a, and 18b are exemplarily described as the n-channel MOS transistors.

Hereinafter, when it is described as a drain, a source, and a gate of the discharge switch 16, it means a drain, a source, and a gate of the MOS transistor that constitutes the discharge switch 16, respectively. Similarly, when it is described as a drain, a source, and a gate of the constant current switch 17, it means a drain, a source, and a gate of the MOS transistor that constitutes the constant current switch 17, respectively. Similarly, when it is described as drains, sources and gates of the cylinder selection switches 18a and 18b, it means drains, sources and gates of the MOS transistors constituting the cylinder selection switches 18a and 18b, respectively.

The boost voltage Vboost is applied from the booster circuit 4 to the drain of the discharge switch 16. Further, the source of the discharge switch 16 is connected to the output terminal 1a on an upstream side of the electronic control unit 101, and a control signal is given to the gate of the discharge switch 16 from the energization control unit 14 of the control IC 6. Thus, the discharge switch 16 can energize the output terminal 1a with the boost voltage Vboost of the booster circuit 4 in accordance with the control of the energization control unit 14 of the control IC 6.

The power supply voltage VB is supplied to the drain of the constant current switch 17. Further, the source of the constant current switch 17 is connected to the output terminal 1a on an upstream side of the ECU 101 through the diode 19 in the forward direction. Further, a control signal is given to the gate of the constant current switch 17 from the energization control unit 14 of the control IC 6. Thereby, the constant current switch 17 can energize the power supply voltage VB to the output terminal 1a according to the control of the energization control unit 14 of the control IC 6.

The diode 19 is connected to prevent a backflow from an output node of the boost voltage Vboost of the booster circuit 4 to an output node of the power supply voltage VB. A recirculation diode 20 is connected in the reverse direction at a position between the upstream output terminal 1a and the ground. The recirculation diode 20 is connected to a path for recirculating the electric current flowing through the fuel injection valves 2a and 2b when the energization current to the fuel injection valves 2a and 2b is interrupted.

The bootstrap circuit 22 is connected to the source of the discharge switch 16 and to the source of the constant current switch 17 from the energization control unit 14 of the control IC 6, respectively, and by the potential boosted by the bootstrap operation of the bootstrap circuit 22, each of the switches 16 and 17 can be switch-controlled.

The fuel injection valves 2a and 2b are connected to positions between the upstream output terminal 1a and the downstream output terminals 1b and 1c, respectively. To a position between the output terminal 1b on the downstream side and the ground, a drain-source connection of the cylinder selection switch 18a and the current detection resistor 24a are connected in series. To a position between the output terminal 1c on the downstream side and the ground, a drain-source connection of the cylinder selection switch 18b and the current detection resistor 24b are connected in series. The current detection resistors 24a and 24b are provided for current detection, and are set to have a resistance of about 0.03Ω, for example.

The drains of the cylinder selection switches 18a and 18b are connected to the downstream output terminals 1b and 1c, respectively. The sources of the cylinder selection switches 18a and 18b are connected to the ground through the current detection resistors 24a and 24b. The gates of the cylinder selection switches 18a and 18b are connected to the energization control unit 14 of the control IC 6. Thus, the cylinder selection switches 18a and 18b can selectively switch the energization of the fuel injection valves 2a and 2b based on the control of the energization control unit 14 of the control IC 6.

Regeneration diodes 21a and 21b are connected in the forward direction to positions between the downstream output terminals 1b and 1c and the output node of the boost voltage Vboost by the booster circuit 4, respectively. These diodes 21a and 21b are connected to energization paths for flowing a regenerative current when the fuel injection valves 2a and 2b are closed, respectively, and are circuits for regenerating an electric current toward the boost capacitor 12. Thus, the diodes 21a and 21b are configured to energize a regenerative current to the boost capacitor 12 of the boost circuit 4 when the fuel injection valves 2a and 2b are closed.

The operation and effect of the above-described basic configuration will be described in the following. Here, the fuel injection valve 2a is a target of valve opening operation, and an example of partial lift injection from the fuel injection valve 2a will be described. In the partial lift injection, an injection process is performed as an operation for closing the fuel injection valve 2a before the fuel injection valve 2a is completely opened. When the power supply voltage VB based on a battery voltage is applied to the electronic control unit 101, the microcomputer 5 and the control IC 6 are activated. The boost control unit 15 of the control IC 6 outputs a boost control pulse to the gate of the MOS transistor 9 to control ON/OFF of the MOS transistor 9. When the MOS transistor 9 is turned ON, an electric current flows through the inductor 8, the MOS transistor 9, and the current detection resistor 10. When the MOS transistor 9 is turned OFF, an electric current based on the energy stored in the inductor 8 flows through the diode 11 to the boost capacitor 12, and the voltage across the boost capacitor 12 increases.

When the boost control unit 15 of the control IC 6 repeats the ON/OFF control of the MOS transistor 9 by outputting the boost control pulse, the boost voltage Vboost of the boost capacitor 12 is charged, or brought up to, a predetermined boost completion voltage Vfu, that exceeds the power supply voltage VB.

Figure 2:
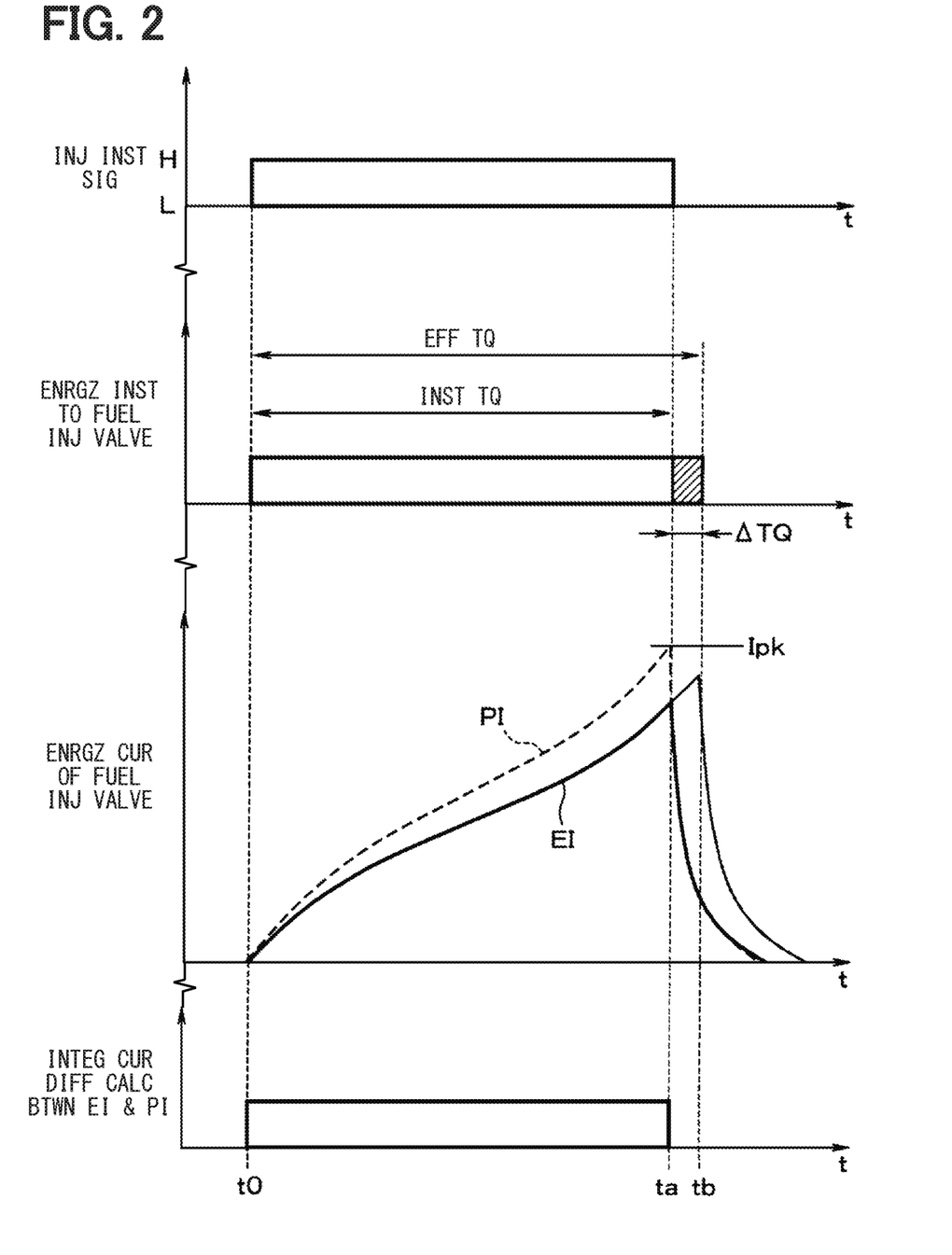
FIG. 2 is a diagram for explaining a relationship among a change in an energization current of a fuel injection valve, an instruction TQ, and an effective TQ.

On the other hand, as shown in FIG. 2, when the microcomputer 5 outputs an active level "H" of the injection instruction signal of the fuel injection valve 2a to the control IC 6, the energization control unit 14 of the control IC 6 starts a peak current control, performing an ON control of the cylinder selection switch 18a together with an ON control of the discharge switch 16 and the constant current switch 17. The microcomputer 5 calculates a required injection amount and calculates an instruction time quantity (TQ) when starting energization of the peak current control at an ON timing t0. The instruction TQ indicates a time (i.e., a length of time) during which the fuel injection valve 2a is energized after the discharge switch 16 is turned ON at the ON timing t0.

The control IC 6 stores an ideal current profile PI (see a broken line in FIG. 2) that is a target current of an energization current EI of the fuel injection valve 2a based on an instructed injection amount in an internal memory, and applies the boost voltage Vboost to the fuel injection valve 2a based on the ideal current profile PI under control of the energization control unit 14. The control IC 6 continues to apply the boost voltage Vboost between the terminals of the fuel injection valve 2a until a peak current Ipk indicated by the ideal current profile PI is reached based on an energization instruction time of the instruction TQ. Then, the energization current EI of the fuel injection valve 2a steeply increases for opening the valve. As shown in FIG. 2, the energization current EI of the fuel injection valve 2a changes non-linearly based on an internal configuration of the fuel injection valve 2a.

The area under the ideal current profile curve can be represented as:

[Equation A]

$$\int_{t0}^{ta}(PI)dt. \tag{A}$$

In other words, the area under the ideal current profile curve is the integral with respect to time of the ideal current profile from the time t0 when the injection instruction signal is set to a high value to the time ta when the injection instruction signal should return to a low value in ideal circumstances to achieve the desired level of charge. This integral represents the total amount of charge accumulated between t0 and ta using an ideal current profile. The integrated current (i.e., delivered charge) is directly proportional to the delivered energy if the voltage is a constant voltage. Thus, the delivered charge is a quick estimate for (or is associated with) the delivered energy as a way to estimate a state of the injection valve.

As shown in FIG. 2, when the gradient of the energization current EI of the fuel injection valve 2a becomes lower than the ideal current profile PI due to various factors such as the ambient temperature environment and/or aging deterioration, an actual injection amount may be greatly decreased from the instructed injection amount, thereby causing deterioration of the A/F value and/or misfire. Therefore, the control IC 6 calculates an integrated current by sampling the electric current flowing through the current detection resistor 24a with the A/D converter by using the current monitor unit 23 in real time, and corrects an output OFF time of an energization instruction signal of an effective TQ relative to an OFF time of the instruction TQ based on a difference between the integrated current of the ideal current profile PI and the integrated current of the detection current of the current monitor unit 23. Although the present embodiment shows a real time calculation of the difference of the integrated currents, the calculation of the difference may also be performable as intermittent calculation or regular-interval calculation.

The area under the detected current profile curve during an ideal time interval can be represented as:

[Equation B]

$$\int_{t0}^{ta}(EI)dt \tag{B}$$

In other words, the area under the detected current profile curve during the time interval required by the ideal current profile curve to accumulate a desired level of charge is the integral with respect to time of the detected energization current EI from the time t0 when the injection instruction signal is set to a high value to the time ta when the injection instruction signal should return to a low value in ideal circumstances to achieve the desired level of charge.

In an example of FIG. 2, the integrated current of the detected current by the current monitor unit 23 from timing t0 to timing ta is smaller than the integrated current of the ideal current profile PI. Therefore, the control IC 6 may set the output OFF time of the energization instruction signal of the instruction TQ to a later timing (see the effective TQ). A correction time ΔTQ may be a predetermined length of time, but may desirably be calculated and set as a length of time based on a difference between the integrated current of the ideal current profile PI and the integrated current of the detected current from timing t0 to timing ta. In such manner, the energization control unit 14 of the control IC 6 continues the ON control of the discharge switch 16, the constant current switch 17, and the cylinder selection switch 18a until, or up to, timing tb indicated by the output OFF time of the energization instruction signal of the effective TQ, and at such timing tb, upon reaching the output OFF time indicated by the effective TQ, performs an OFF control of the discharge switch 16, the constant current switch 17, and the cylinder selection switch 18a.

The area under a corrected detected current profile curve can be represented as:

[Equation C]

$$\int_{t0}^{tb=(ta+\Delta TQ)}(EI)dt, \quad (C)$$

where tb=ta+c, i.e., a corrected measurement time.

In other words, the area under the detected current profile curve during the corrected measurement time is the integral with respect to time of the detected energization current EI from the time t0 when the injection instruction signal is set to a high value to the corrected measurement time tb, which represents an actual time the injection instruction signal should be set back to a low value.

The correction value ΔTQ is set such that the area under the detected current profile curve during the corrected measurement time is equal to the area under the ideal current profile curve as shown in Equation D. In other words, the corrected measurement time tb is selected to achieve the same desired level of charge in the actual device as for the ideal current profile. The correction value ΔTQ accounts for the gradient of the energization current EI of the fuel injection valve 2a becoming lower than the ideal current profile PI. In this way, a desired charge can be obtained using a fuel injection valve 2a having an energization current EI with a gradient that is lower that an ideal gradient by making certain that the two equations are equivalent.

[Equation D]

$$\int_{t0}^{ta}(PI)dt=\int_{t0}^{tb=(ta+\Delta TQ)}(EI)dt \quad (D)$$

Figure 3A:
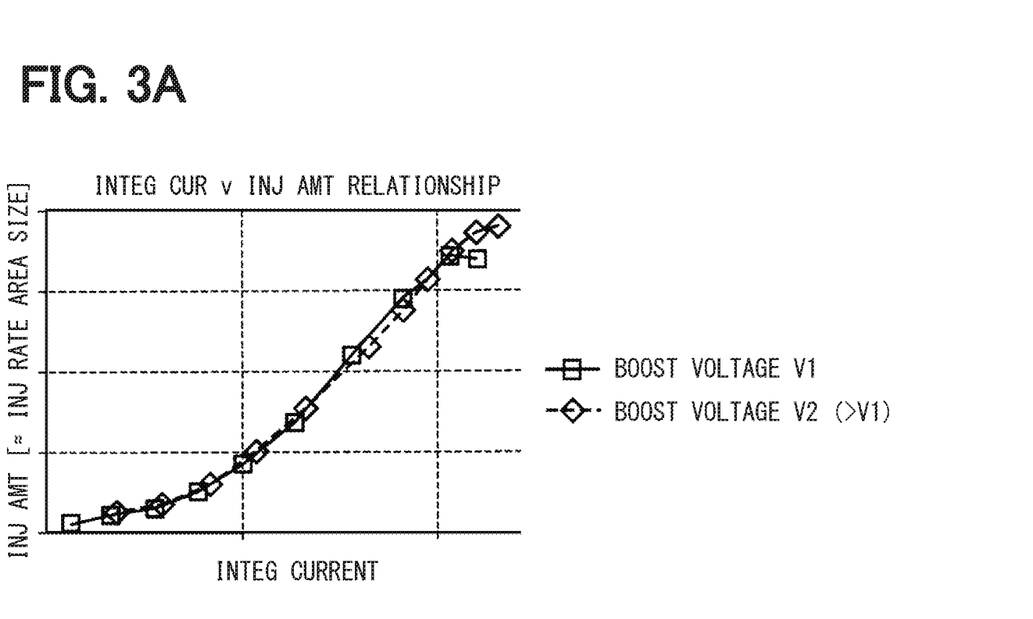
FIG. 3A is a diagram of a simulation result of a correlation between an integrated current and an injection amount.

As shown in FIG. 3A, there is a positive correlation between an integrated current value of the energization current EI of the fuel injection valve 2a and the actual injection amount. That is, if the integrated current value of the energization current EI of the fuel injection valve 2a increases, the actual injection amount also increases. It can also be seen that the actual injection amount hardly changes even if the boost voltage Vboost for driving changes from V1 to V2 (>V1). Therefore, when the control IC 6 delays the output OFF time of the energization instruction signal of the instruction TQ as shown in FIG. 2, the integrated current of the energization current EI of the fuel injection valve 2a is brought close to (i.e., is matched with) the integrated current of the ideal current profile PI as much as possible. As a result, by compensating for the lack of the integrated current, the gap of the injection amount with respect to the target injection amount can be supplemented.

Thereby, it is not necessary to adjust the energization instruction time in advance in view of variation of the product for preventing misfire, and the energization instruction time can be extended in real time. As a result, misfire countermeasures can be taken without deteriorating the fuel mileage as much as possible.

Figure 3B:
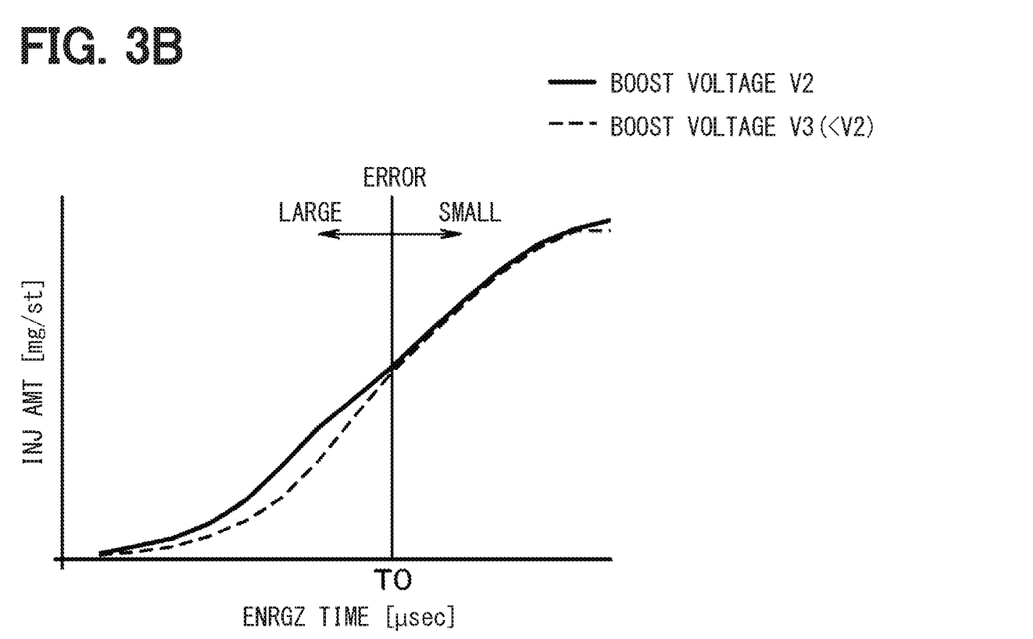
FIG. 3B is a diagram of a simulation result of a correlation between the injection amount, the energization time, and a boost voltage.

Further, according to the inventor, as shown in FIG. 3B, when the energization time of the fuel injection valve 2a is longer than a predetermined time T0, there is little error in the injection amount even if there is a difference in the boost voltage Vboost. On the other hand, when the energization time of the fuel injection valve 2a is shorter than the predetermined time T0, the injection amount error due to the difference between the boost voltages (Vboost) V2 and V3 (<V2) increases.

Therefore, the control IC 6 may determine whether it is before or after the lapse of the predetermined time T0 from an output of the energization instruction signal, and may perform step-wise change of the correction time ΔTQ of the instruction TQ (i.e., a correction time of the injection OFF time) based on the determination result of before or after. In such manner, the correction of the injection OFF time is high accuracy performable. Note that, during such correction, if it is before the lapse of the predetermined time T0, the correction time ΔTQ may be determined based on the value of the boost voltage Vboost, and, if it is after the lapse of the predetermined time T0, the correction time ΔTQ may be set to a predetermined value.

Further, the predetermined time T0, at which an amount of the error is determined as large or small, is set to an amount, i.e., a length of time, about a standard value of the energization instruction time of the instruction TQ for energizing the peak current Ipk of the ideal current profile PI (i.e., t0 to ta in FIG. 2). Therefore, (A) if the energization current to the fuel injection valve 2a is turned OFF, i.e., is stopped, before it reaches the peak current Ipk, the difference in the integrated currents increases according to the difference in the boost voltage Vboost. On the other hand, (B) if the energization current is turned OFF around (e.g., after reaching) the peak current timing, the difference in the integrated current becomes small (i.e., smaller than the above) despite (i.e., if any) the difference in the boost voltage Vboost.

Therefore, based on a determination of whether the energization current of the fuel injection valve 2a is turned OFF before or after reaching the peak current Ipk of the ideal current profile PI, the control IC 6 can preferably switch the correction time ΔTQ of the instruction TQ (i.e., can switch the injection OFF time to the corrected time/timing) in a stepwise manner based on the determination result, for an accurate correction of the injection OFF time. During such correction, when the peak current Ipk is not yet reached (i.e., before the energization current reaches the peak current Ipk), the correction time ΔTQ may be set based on the value of the boost voltage Vboost, for example.

Second Embodiment

Figure 4:
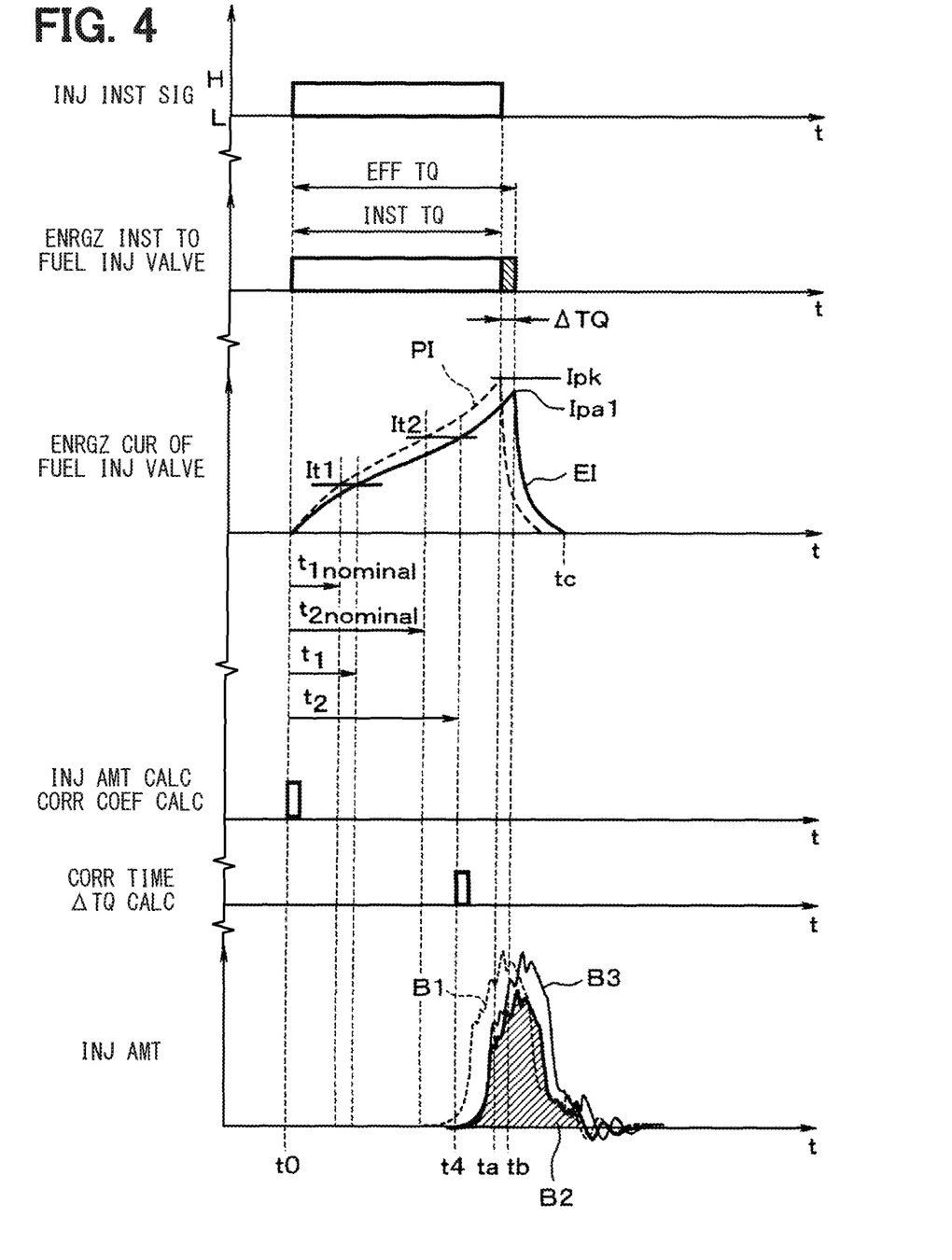
FIG. 4 is a diagram for explaining a relationship among a change in the energization current of the fuel injection valve, the instruction TQ, and the effective TQ in a second embodiment.

FIG. 4 to FIG. 7 show explanatory diagrams of the seventh embodiment. In the second embodiment, the configuration will be described in which the calculation of the difference of the integrated currents (i.e., between the integrated current based on the ideal current profile PI and the integrated current based on the energization current EI of the fuel injection valve 2a) is simplified for the reduction of the amount of calculation (i.e., calculation load) compared to the first embodiment. As shown in FIG. 4, when the microcomputer 5 outputs the active level "H" of the injection instruction signal of the fuel injection valve 2a to the control IC 6, the energization control unit 14 of the control IC 6 performs (i.e., starts) a peak current control at ON timing t0, performing ON control of the cylinder selection switch 18a, and performing ON control of the discharge switch 16 and the constant current switch 17.

The microcomputer 5 calculates the required injection amount at the start of the peak current control, and calculates the instruction TQ and correction coefficients α1 and β1. The instruction TQ indicates the time (i.e., a length of time during which the fuel injection valve 2a is energized starting from ON timing t0 of the discharge switch 16. The correction coefficient α1 is a coefficient used for estimating a difference A1 of the integrated currents (mentioned later), which is a coefficient calculated in advance according to the load characteristics of the fuel injection valve 2a and the like. The correction coefficient β1 is a coefficient used for estimating an actual peak current estimated value Ipa1, which is a coefficient calculated in advance according to the load characteristics of the fuel injection valve 2a and the like.

Figure 5:
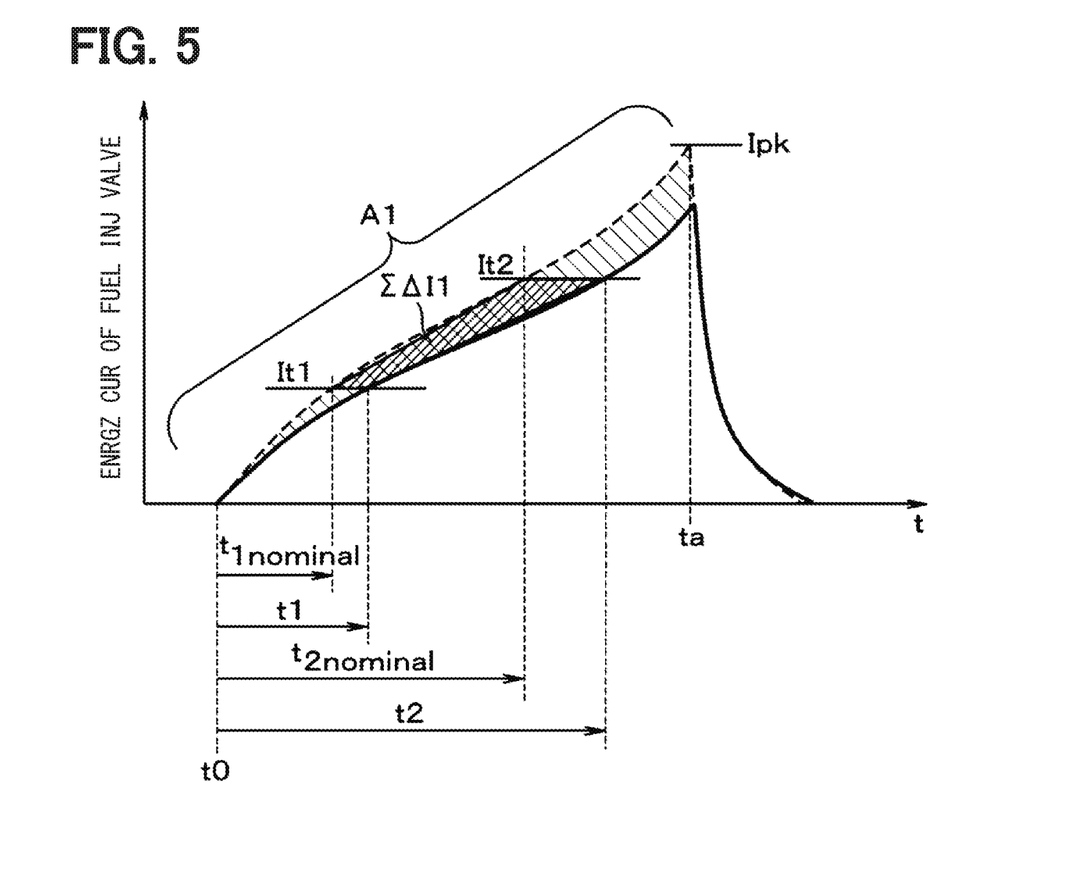
FIG. 5 is an explanatory diagram of a method for calculating a difference of the integrated currents (part 1)

The control IC 6 calculates a difference of the integrated currents between (i) the one according to the ideal current profile PI from an ideal reach time t1nominal reaching a current threshold It1 to an ideal reach time t2nominal reaching a current threshold It2 and (ii) the one based on (i.e., derived by integrating) the energization current EI of the fuel injection valve 2a from a reach time t1 actually reaching the current threshold It1 to a reach time t2 actually reaching the current threshold It2, which is designated as a difference ΣΔI1 of the integrated currents. Since the difference ΣΔI1 of the integrated currents is an area surrounded by a non-linear current curve, it may be necessary to detect the electric current in real time in order to calculate it accurately, which may require huge amount of calculation and pose heavy calculation load. Therefore, as shown in FIG. 5, the size of a trapezoidal area with four apexes (t, I)=(t1nominal, It1), (t1, It1), (t2nominal, It2), (t2, It2) may be considered as the integrated current for the simplification of the calculation of the difference ΣΔI1. In such manner, the control IC 6 can calculate the difference ΣΔI1 of the integrated currents simply by detecting the reach times t1 and t2, i.e., two timings of reaching the current thresholds It1 and It2. Further, as shown in the following equation (1), the control IC 6 can approximate a difference A1 of the integrated currents between the one according to the ideal current profile PI and the one according to the energization current EI of the fuel injection valve 2a for a period from timing t0 to timing t1, by multiplying the difference ΣΔI1 of the integrated currents by the correction coefficient α1 calculated in advance.

[Equation 1]

$$A1 = \sum \Delta I1 \times \alpha 1 = \frac{\left\{ \begin{array}{c} (t_1 - t_{1nominal}) + \\ (t_2 - t_{2nominal}) \end{array} \right\} \times (I_{t2} - I_{t1})}{2} \times \alpha 1 \qquad (1)$$

Figure 6:
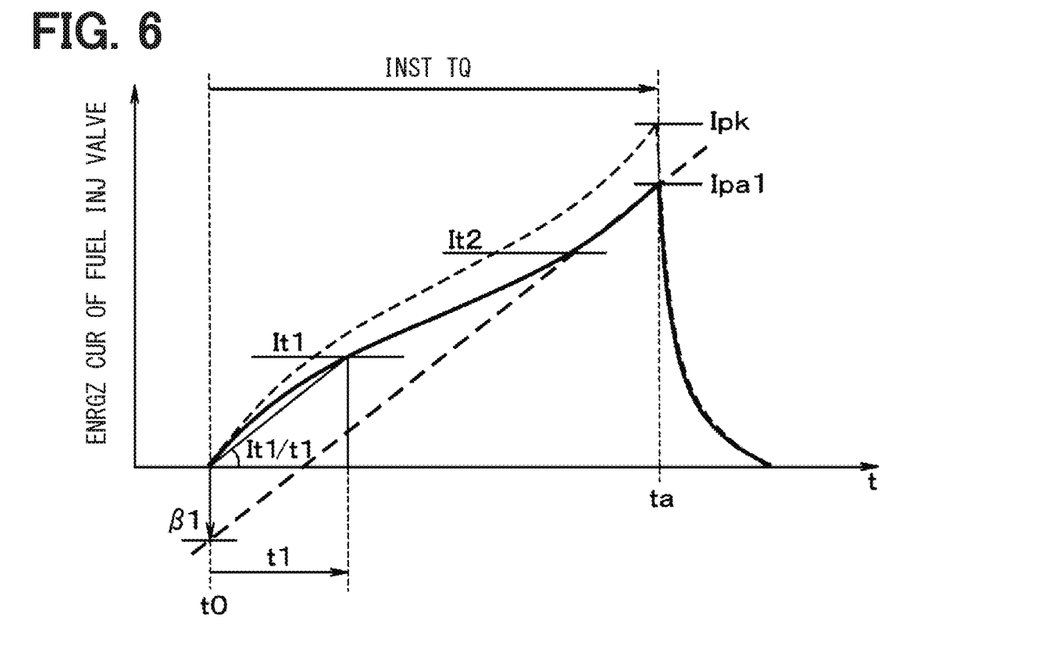
FIG. 6 is an explanatory diagram of a method for calculating an estimated peak current value.

Next, as shown in FIG. 6, the control IC 6 calculates the current gradient from ON timing t0 of the injection instruction signal to the reach time t1 when the current reaches the current threshold It1, and adds the correction coefficient β1 as an intercept thereto, and calculates the peak current estimated value Ipa1 at the time when the reference value of the energization instruction time indicated by the instruction TQ has lapsed. During such calculation, the peak current estimated value Ipa1 may be calculated based on the equation (2).

[Equation 2]

$$I_{pa1} = \frac{I_{t1}}{t_1} \times TQ + \beta 1 \qquad (2)$$

Figure 7:
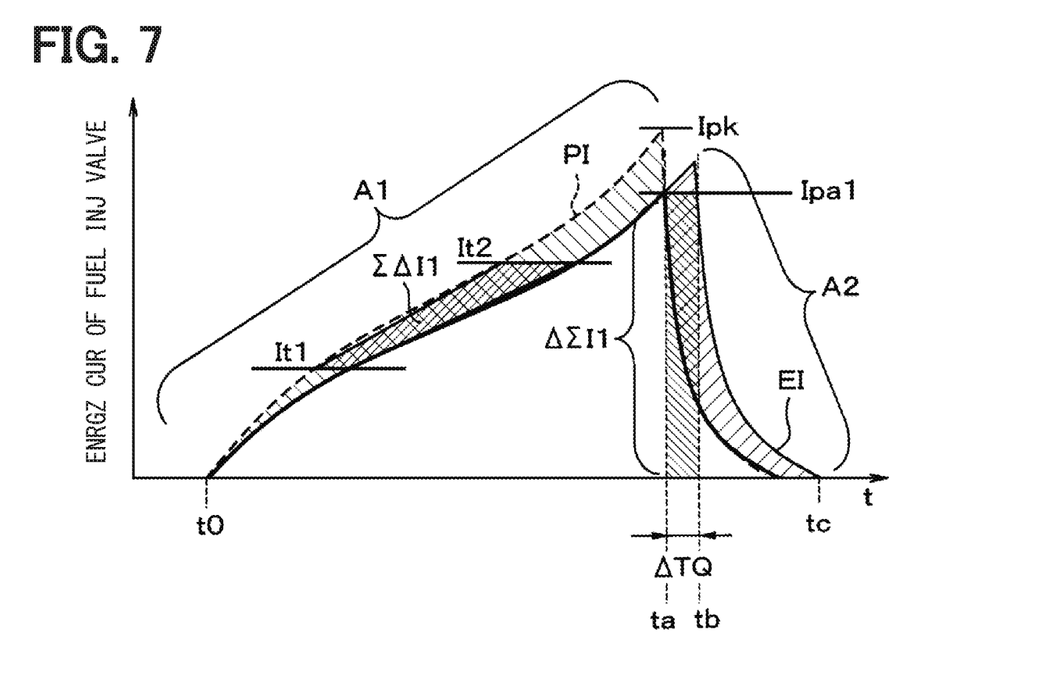
FIG. 7 is an explanatory diagram of a method for calculating a difference of the integrated currents (part 2)

Next, the control IC 6 calculates the correction time ΔTQ for correcting the difference A1 of the integrated currents. As shown in FIG. 7, the ideal current profile PI is larger than the energization current EI of the fuel injection valve 2a before timing ta, but after timing ta, the energization current EI of the fuel injection valve 2a is the ideal current profile is greater than the ideal current profile PI.

Therefore, the difference of the integrated currents between the ideal current profile PI and the energization current EI of the fuel injection valve 2a is calculable as a difference of two differences, i.e., between (i) the difference A1 of the integrated currents from timing t0 to timing ta and (ii) a difference A2 of the integrated currents from timing ta to timing tc when the energization current EI of the fuel injection valve 2a ends. The difference A2 of the integrated currents from timing ta to timing tc is a difference appended to the instruction TQ as a result of extension of the instruction TQ, i.e., by extending the correction time ΔTQ.

The control IC 6 may calculate the difference A2 of the integrated currents in detail. However, the calculation load of such calculation may increase because it is a calculation of an area size surrounded by an electric current curve as shown in FIG. 7. Therefore, the control IC 6 may calculate the difference A2 of the integrated currents, by interpreting that the difference ΔΣI1 of the integrated currents shown in FIG. 7 is the difference of the integrated currents A2, for the reduction of calculation time of the difference A2 of the integrated currents. That is, the control IC 6 may consider a rectangle with the peak current estimated value Ipa1 as a long side and the correction time ΔTQ as a short side as the difference ΔΣI1 of the integrated currents, and may consider the difference ΔΣI1 of the integrated currents as equivalent to the difference A2 of the integrated currents, in the simplified calculation. Then, the control IC 6 can easily calculate the difference A2 of the integrated currents by calculating the size of the rectangular area, and the amount of calculation can be drastically reduced. The control IC 6 may then calculate a correction time ΔTQ that satisfies a condition that the difference A1 of the integrated currents becomes equal to the difference A2 of the integrated currents (≈ΔTQ×Ipa1), i.e., may calculate the correction time ΔTQ based on the following equation (3).

[Equation 3]

$$\Delta TQ = \frac{A1}{I_{pa1}} = \frac{\frac{\left\{ \begin{array}{c} (t_1 - t_{1nominal}) + \\ (t_2 - t_{2nominal}) \end{array} \right\} \times (I_{t2} - I_{t1})}{2} \times \alpha 1}{\frac{I_{t1}}{t_1} \times TQ + \beta 1} \qquad (3)$$

Next, as shown in FIG. 4 at timing t4, the control IC 6 corrects the energization instruction time before timing tb when the current detected by the current monitor unit 23 reaches the peak current estimated value Ipa1, i.e., correcting the instruction TQ+the correction time ΔTQ to the effective TQ (i.e., an effective energization instruction time). Thereby, the instruction TQ can be corrected in a simplified manner, and the energization instruction time can be extended.

FIG. 4 shows an example of the actual injection amount. The broken line indicates an ideal injection amount B1 when the electric current is supplied according to the ideal current profile PI, and a hatched area indicates an injection amount B2 based on a no-correction assumption, and the solid line indicates a post-correction injection amount B3. It can be seen that the post-correction injection amount B3 approaches the ideal injection amount B1 by performing the correction (to the amount B2). According to the present embodiment, similar to the first embodiment, it is not necessary to pre-adjust the energization instruction time in consideration of variations for preventing misfire, and the energization instruction time can be extended. As a result, countermeasures for misfire can be taken without deteriorating the fuel mileage as much as possible. Moreover, compared to the first embodiment, it is not necessary to calculate the difference of the integrated currents while detecting the energization current of the fuel injection valve 2a in real time during the injection control, thereby drastically reducing the calculation amount. According to the present embodiment, the control IC 6 calculates the correction time ΔTQ during a period from a reach time when the current threshold It2 is lastly reached among the plurality of the current thresholds It1 and It2 to a subsequent reach time when the peak current estimated value Ipa1 is reached, and corrects the output OFF time. Therefore, the output OFF time of the energization instruction signal can be corrected with a margin, i.e., well in advance.

In the above description, an example of correction method in which the output OFF time of the energization instruction signal is corrected based on the equations (1) to (3) has been described. However, those equations merely show an example, and the present disclosure is not limited to such method. The control IC 6 may correct the output OFF time of the energization instruction signal based on the difference of the integrated currents, i.e., by using the difference between the integrated currents up to the plurality of the reach times t1 and t2 at which the plurality of the current thresholds It1 and It2 are reached. The control IC 6 corrects the output OFF time of the energization instruction time based on the reach times t1 and t2 with reference to a predetermined reference value of the energization instruction time. Therefore, the correction of the output OFF time of the energization instruction time is performable simply by increasing or decreasing the reference value, thereby the arithmetic processing can be simplified and reducible as much as possible.

Third Embodiment

Figure 8:
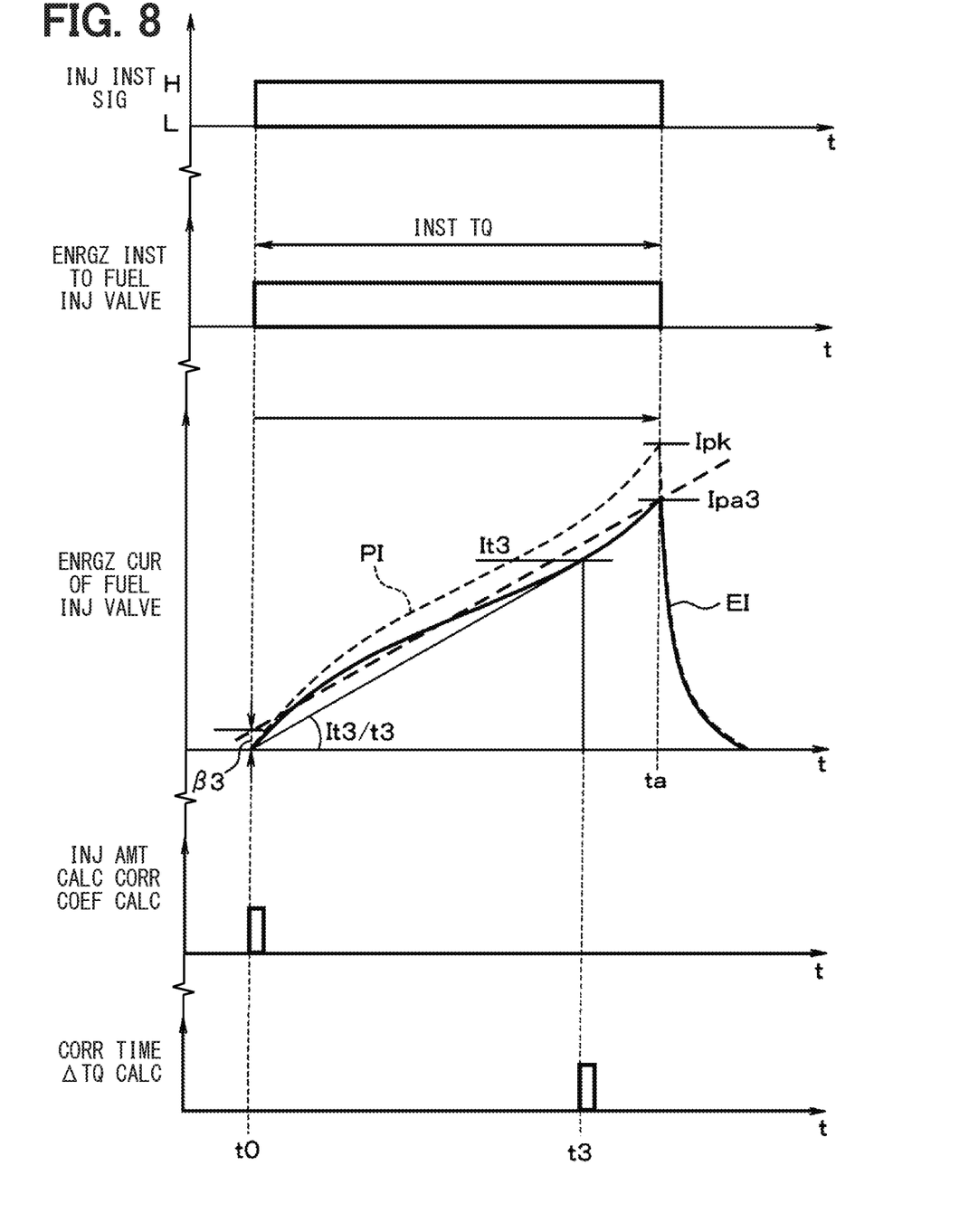
FIG. 8 is a diagram for illustrating a relationship among a change in the energization current of the fuel injection valve, the instruction TQ, and the effective TQ in a third embodiment, and for explaining a method for calculating the estimated peak current value.
Figure 9:
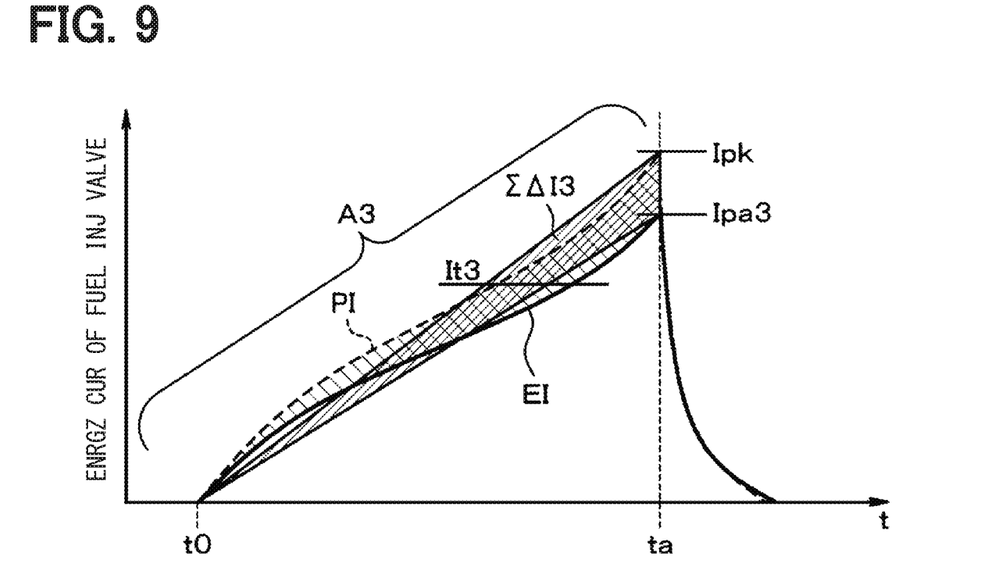
FIG. 9 is an explanatory diagram of a method for calculating a difference of the integrated currents (part 1)
Figure 10:
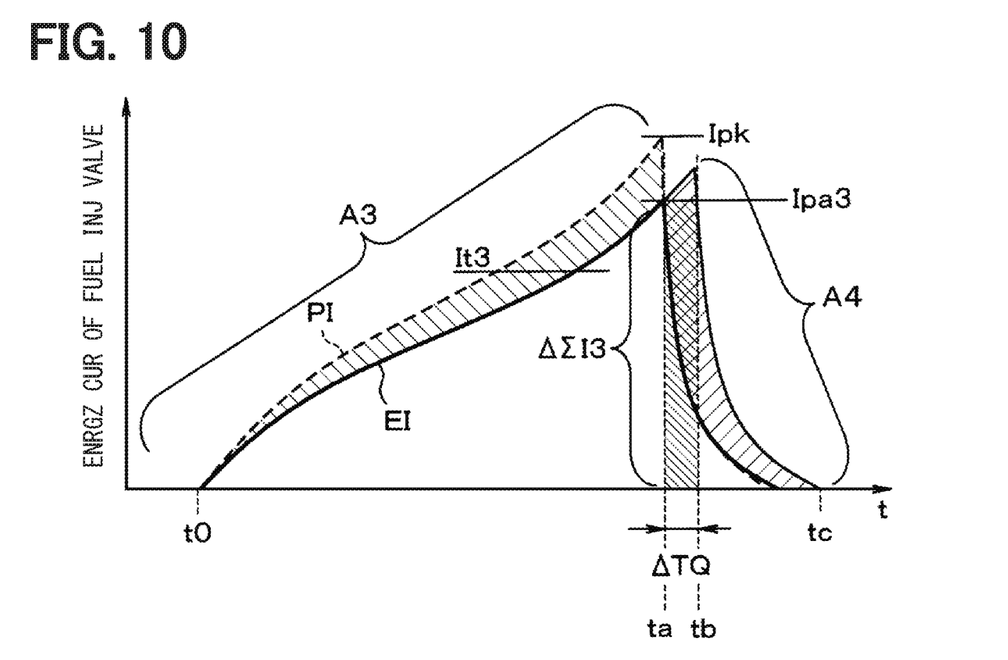
FIG. 10 is an explanatory diagram of a method for calculating a difference of the integrated currents (part 2)

FIG. 8 to FIG. 10 are explanatory diagrams of the third embodiment. In the third embodiment, an example embodiment is described, in which the difference of the integrated currents between the ideal current profile PI and the energization current EI of the fuel injection valve 2a is also calculated in a simplified manner, reducing the amount of calculation as compared with the first embodiment. As shown in FIG. 8, when the microcomputer 5 outputs the active level "H" of the injection instruction signal of the fuel injection valve 2a to the control IC 6 at timing t0, the energization control unit 14 of the control IC 6 starts the peak current control at ON timing t0, performing the ON control of the cylinder selection switch 18a and performing the ON control of the discharge switch 16 and the constant current switch 17.

The microcomputer 5 calculates a required injection amount at the start of the peak current control, and calculates the instruction TQ and correction coefficients α3 and β3. The instruction TQ indicates an energization instruction time. The correction coefficient α3 is a coefficient for estimating a difference A3 of the integrated currents (described later), and is a coefficient that is calculated in advance according to the load characteristics of the fuel injection valve 2a. The correction coefficient β3 is a coefficient used for estimating a peak current estimated value Ipa3, and is a coefficient calculated in advance according to the load characteristics of the fuel injection valve 2a.

The control IC 6 calculates the current gradient from ON timing t0 of the injection instruction signal to a reach time t3 when the energization current reaches a current threshold It3, adds the correction coefficient β3 as an intercept thereto, and calculates the peak current estimated value Ipa3 at the time when the reference value of the energization instruction time indicated by the instruction TQ has lapsed. The control IC 6 may calculate the peak current estimated value Ipa3 based on the following equation (4).

[Equation 4]

$$I_{pa3} = \frac{I_{t3}}{t_3} \times TQ + \beta 3 \quad (4)$$

Next, the control IC 6 estimates the difference A3 of the integrated currents between (i) the ideal current profile PI from ON timing t0 of the injection instruction signal to the predetermined peak current Ipk and (ii) the energization current EI from ON timing t0 to the predetermined peak current estimated value Ipa3. As shown in FIG. 9, the control IC 6 may calculate an area size of a triangle formed by the predetermined peak current Ipk of the ideal current profile PI, the instruction TQ, and the previously calculated peak current estimated value Ipa3 as an integrated current difference ΣΔI3 (i.e., a difference ΣΔI3 of the integrated currents), and may multiply the difference ΣΔI3 by the correction coefficient α3, for the estimation of the integrated current difference A3. The control IC 6 may estimate the difference A3 of the integrated currents based on the following equation (5).

[Equation 5]

$$A3 = \sum \Delta I3 \times \alpha 3 = \frac{\left\{I_{pk} - \left(\frac{I_{t3}}{t_3} \times TQ + \beta 3\right)\right\} \times TQ}{2} \times \alpha 3 \quad (5)$$

Next, the control IC 6 calculates the correction time ΔTQ for correcting the difference A3 of the integrated currents. As shown in FIG. 7, the ideal current profile PI is larger than the energization current EI of the fuel injection valve 2a before timing ta, but after timing ta, the energization current EI of the fuel injection valve 2a is larger than the ideal current profile PI.

Therefore, the difference of the integrated currents between the ideal current profile PI and the energization current EI of the fuel injection valve 2a is calculable as a difference of A3 and A4, i.e., a difference between (i) the difference A3 of the integrated currents from timing t0 to timing ta and (ii) a difference A4 from timing ta to timing tc when the energization current EI of the fuel injection valve 2a ends. The difference A4 of the integrated currents between timing ta and timing tc is a difference caused by an extension the instruction TQ by an amount of the correction time ΔTQ.

Although the control IC 6 may calculate the difference A4 of the integrated currents in detail (i.e., accurately), for the reduction of the calculation time of the difference A4 of the integrated currents, just like the second embodiment, the difference ΔΣI3 of the integrated currents shown in FIG. 10 may be considered as the difference A4 of the integrated currents, and ΔΣI3 may be calculated as the difference A4. That is, the correction time ΔTQ may be calculable based on an assumption that a rectangle with the peak current estimated value Ipa3 as a long side and the correction time ΔTQ as a short side is the difference ΔΣI3 of the integrated currents and is equivalent to the difference A4 of the integrated currents. In such manner, the control IC 6 can easily calculate the difference A4 of the integrated currents by calculating the size of a rectangular area, which drastically reduces the calculation amount. Then, the control IC 6 can calculate the correction time ΔTQ that satisfies a condition that the difference A3 of the integrated currents becomes equal to the difference A4 of the integrated currents (≈ΔTQ×Ipa3), which may be realized by the calculation of the correction time ΔTQ based on the following equation (6).

[Equation 6]

$$\Delta TQ = \frac{A3}{I_{pa3}} = \frac{\left\{I_{pk} - \left(\frac{I_{t3}}{t_3} \times TQ + \beta 3\right)\right\} \times TQ}{\frac{I_{t3}}{t_3} \times TQ + \beta 3} \times \alpha 3 \quad (6)$$

Next, the control IC 6 corrects the energization instruction time before peak current timing, i.e., during a period within which the detected current reaches the peak current estimated value Ipa3, for correcting the energization instruction time to an effective energization instruction time (i.e., "the instruction TQ+correction time ΔTQ" designated as the effective TQ. Thereby, the instruction TQ can be corrected, and the energization instruction time can be extended. According to the present embodiment, similar to the first and second embodiments, it is not necessary to pre-adjust the energization instruction time in consideration of variations for preventing misfire, and the energization instruction time can be extended. As a result, countermeasures for misfire can be taken without deteriorating the fuel mileage as much as possible. Moreover, it is not necessary to calculate the difference of the integrated currents in real time during the injection control as compared with the first embodiment, thereby reducing the calculation amount. In the above description, an example of correction of the output OFF time of the energization instruction signal based on the equations (4) to (6) has been described. However, those equations merely show an example, and the correction method is not necessarily limited thereto. That is, the control IC 6 may detect the reach time t3 when the electric current detected by the current monitor unit 23 reaches the predetermined current threshold It3, and may correct the output OFF time of the energization instruction signal based on the reach time t3 and the predetermined current threshold It3. In such manner, for correcting the output OFF time of the energization instruction time. The control IC 6 corrects the output OFF time of the energization instruction time based on the reach time t3 with reference to a predetermined reference value of the energization instruction time. Therefore, the correction of the output OFF time of the energization instruction time is performable simply by increasing or decreasing the reference value, thereby the arithmetic processing can be simplified and reducible as much as possible.

Fourth Embodiment

Figure 11:
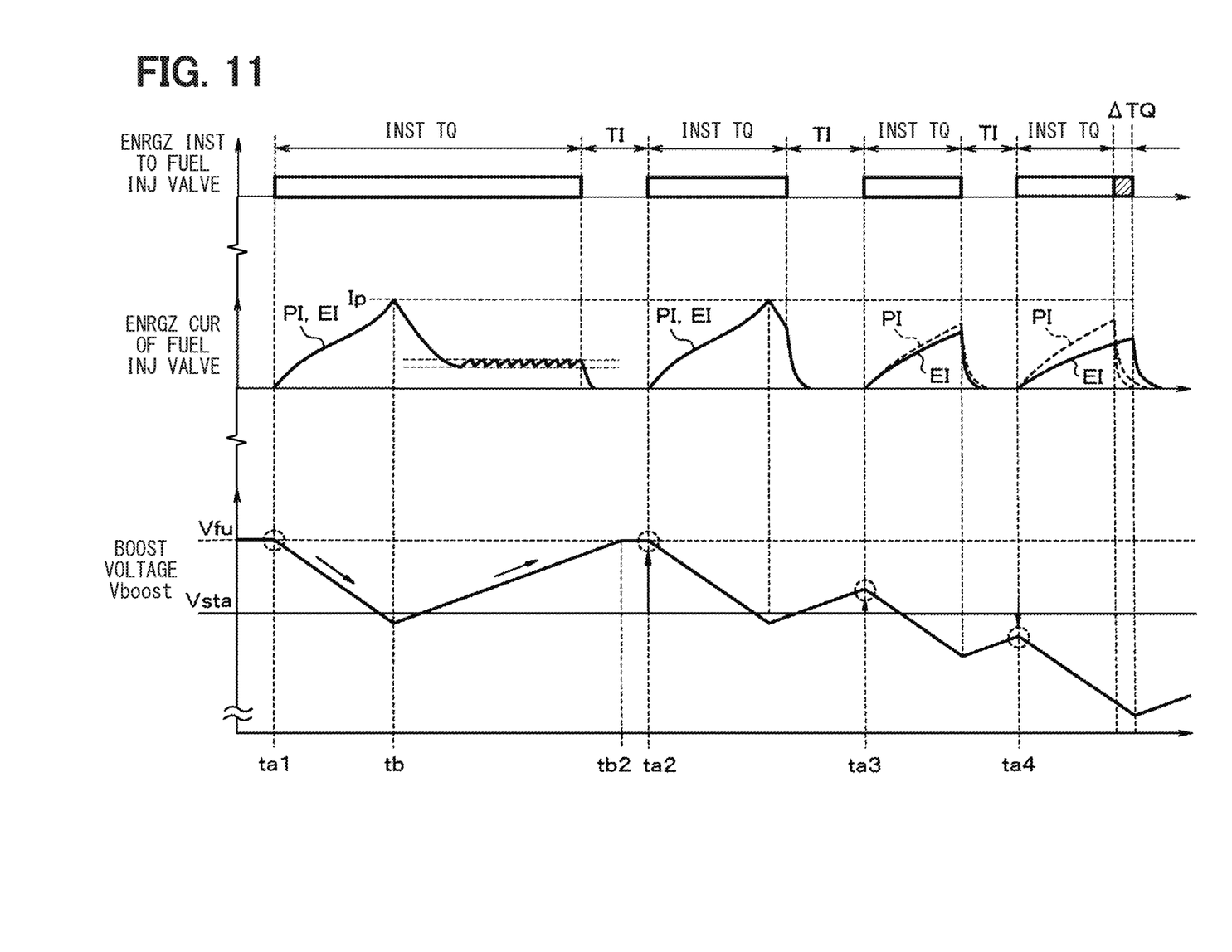
FIG. 11 is a timing chart of changes in a boost voltage during a multi-stage injection in a fourth embodiment.

FIG. 11 is an explanatory diagram of the fourth embodiment. In the fourth embodiment, an example of multi-stage injection, having a short inter-injection interval TI between the injections, is described. When the control IC 6 performs an injection control on the fuel injection valve 2a, the boost voltage Vboost can be applied to the fuel injection valve 2a by turning ON the discharge switch 16 (i.e., at timings ta1 to ta4 in FIG. 11). When the boost voltage Vboost is applied to the fuel injection valve 2a, the electric charge accumulated in the boost capacitor 12 of the booster circuit 4 is consumed, and the boost voltage Vboost drops from the boost completion voltage Vfu. Normally, when the control IC 6 injects fuel continuously in multi stages, a large amount of electric power stored in the boost capacitor 12 is consumed and the boost voltage Vboost greatly lowers.

When the boost voltage Vboost drops down to the boost start voltage Vsta, the boost controller 15 starts the boost control by outputting a boost control pulse to the MOS transistor 9 (i.e., at timing tb in FIG. 11). Then, when the boost voltage Vboost reaches the boost completion voltage Vfu, the boost control unit 15 stops the boost control (i.e., at timing tb2 in FIG. 11).

In particular, as shown in FIG. 11, when the control IC 6 performs multi-stage injection with a short interval TI, the boost voltage Vboost tends to decrease continuously in the subsequent injection(s). As shown in FIG. 11, when the boost voltage Vboost is higher than the boost voltage reference value Vsta and close to the boost completion voltage Vfu, the energization current EI of the fuel injector 2a substantially matches with the ideal current profile PI. However, it has been found that, when the boost voltage Vboost drops to be lower than the boost voltage reference value Vsta, the energization current EI of the fuel injection valve 2a tends to be significantly lower than the ideal current profile PI. Therefore, if the boost voltage Vboost continues to decrease, the actual injection amount may fail to satisfy the instructed injection amount.

Therefore, the control IC 6 monitors the boost voltage Vboost at timings ta1 to ta4 at the start of injection (i.e., at injection start timings), (i) for performing correction on condition that the boost voltage Vboost is lower than the boost voltage reference value Vsta, and (ii) for not performing correction on condition that the boost voltage Vboost is equal to or higher than the boost voltage reference value Vsta. In such manner, when the boost voltage Vboost is guaranteeable, i.e., can be sufficiently output with margin, the valve drive is performed only for the energization instruction time of the instruction TQ, and, when the boost voltage Vboost is lower than the predetermined boost voltage reference value Vsta, the energization instruction time can be extended by an amount of the correction time ΔTQ by performing correction. According to the present embodiment, the energization control unit 14 of the control IC 6 detects the boost voltage Vboost applied to the fuel injection valve 2a at timings ta1 to ta4 at the start of injection, compares the detected voltage with the boost voltage reference value Vsta, and performs correction on condition that the detected voltage is lower than the voltage boost reference value Vsta, or does not perform correction on condition that the detected voltage is equal to or higher than the boost voltage reference value Vsta. Accordingly, correction can be performed when necessary. In the present embodiment, an example in which the boost start voltage Vsta and the boost voltage reference value Vsta have the same value. However, the two values may be different from each other.

Other Embodiments

The present disclosure should not be limited to the embodiments described above, and may include various modifications without departing from the gist of the present disclosure. For example, the following modifications or expansions are possible. A plurality of the above-described embodiments may be combined as necessary.

In the above-described embodiment, the fuel injection valves 2a and 2b for two cylinders are shown and the fuel injection valve 2a for one cylinder is driven, just as an example to simplify the description. The same applies to a case of driving the valve 2b, and the same contents can be implemented in a case of using other numbers of cylinder such as four cylinders, six cylinders or the like. The configuration of the drive circuit 7 is not limited to the configuration shown in the above-described embodiments, and may be changed as appropriate.

In the second embodiment, the difference $\Sigma\Delta I1$ of the integrated currents is simply calculated by calculating the trapezoidal area, but the present disclosure is not limited to such an example. In the third embodiment, an area size of a triangle defined by the predetermined peak current Ipk of the ideal current profile PI, the instruction TQ, and the peak current estimated value Ipa3 is calculated, which simplifies the calculation of the integrated current difference $\Sigma\Delta I3$. However, the present disclosure is not limited to such an example.

The energization current EI of the fuel injection valve 2a changes non-linearly before reaching the peak current Ipk and after reaching the peak current Ipk. Therefore, it may be preferable to simplify the calculation of the difference of the integrated currents by approximating the integrated amount of the electric current by using a polygon such as a triangle, a rectangle, a trapezoid and the like. As a result, the amount of calculation is drastically reducible.

Means and/or functions performed by the microcomputer 5 and the control IC 6 can be provided or implemented by using software recorded in a substantial, non-transitory memory device and a computer executing such software, as well as software, hardware, or a combination thereof. For example, when a control device is provided by an electronic circuit that is hardware, the control device can be implemented by using a digital circuit or an analog circuit including one or more logic circuits. Further, for example, when the control device performs various controls by using software, a program for such control is stored in a storage unit, and a method corresponding to such program is performed by a control subject (i.e., by a device) that executes such program.

In the above-described embodiments, the discharge switch 16, the constant current switch 17, and the cylinder selection switches 18a and 18b have been described as implemented as the MOS transistors. However, other types of transistors such as bipolar transistors and various types of switches may also be used.

Two or more embodiments described above may be combined to implement the present disclosure.

A part of the above-described embodiment may be dispensed of as long as the problem identified in the background is resolvable. In addition, various modifications from the present disclosure in the claims are considered also as an embodiment thereof as long as such modification pertains to the gist of the present disclosure.

Although the present disclosure is described based on the above embodiments, the present disclosure is not limited to the above embodiments and/or to the structure described therein. The present disclosure is intended to cover various modification examples and equivalents thereof. In addition, various combinations, including one or more elements added/subtracted thereto/therefrom, may also be considered as the present disclosure and understood as the technical thought thereof

What is claimed is:

1. An injection controller that injects fuel from a fuel injection valve, the injection controller comprising:
a control unit configured to output an energization instruction signal for controlling the fuel injection valve; and
a current detector configured to detect an electric current flowing in the fuel injection valve,
wherein
the control unit corrects an output OFF time of the energization instruction signal based on a difference between (i) an integrated current of an ideal current profile and (ii) an integrated current of the detected current detected by the current detector, and
the integrated current of the ideal current profile is a first ideal charge amount flowing into the fuel injection valve during a first continuous time period within a single ideal fuel injection cycle.

2. The injection controller of claim 1, further comprising:
a reach time detection unit configured to detect a reach time of the detected current detected by the current detector for reaching a predetermined current threshold, wherein
the control unit corrects the output OFF time based on the reach time and the predetermined current threshold.

3. The injection controller of claim 2, wherein
the control unit corrects the output OFF time of the energization instruction time with reference to a reference value of the energization instruction time determined based on the reach time.

4. The injection controller of claim 2, wherein
a peak current estimation unit is configured to estimate a peak current estimated value based on the reach time of the detected current for reaching the predetermined current threshold, wherein
the control unit corrects the output OFF time of the energization instruction signal so that a post-correction integrated current after correction of the energization instruction signal based on the peak current estimated value becomes equal to the integrated current of the ideal current profile.

5. The injection controller of claim 1, wherein
the control unit corrects the output OFF time of the energization instruction signal based on a difference of the integrated currents up to a plurality of reach times for reaching a plurality of current thresholds.

6. The injection controller of claim 5, further comprising:
a peak current estimation unit configured to estimate a peak current estimated value based on the plurality of reach times of the detected current for reaching the plurality of current thresholds, wherein
the control unit corrects the output OFF time of the energization instruction signal by calculating a correction time during a period from a reach time when the energization current of the fuel injection valve lastly reaches a current threshold among the plurality of the current thresholds to a subsequent reach time when the energization current of the fuel injection valve reaches the peak current estimated value.

7. The injection controller of claim 5, further comprising:
a peak current estimation unit configured to estimate a peak current estimated value based on the plurality of reach times of the detected current for reaching the plurality of current thresholds, wherein
the control unit corrects the output OFF time of the energization instruction signal so that a post-correction integrated current after correction of the energization instruction signal based on the peak current estimated value becomes equal to the integrated current of the ideal current profile.

8. The injection controller of claim 1, wherein
the control unit determines whether the energization current of the fuel injection valve has reached the peak current of the ideal current profile, and switches a correction time of the output OFF time in a stepwise manner based on a determination result regarding the reaching of the peak current.

9. The injection controller of claim 1, wherein
the control unit determines whether a predetermined time has lapsed from an output of the energization instruction signal, and switches a correction time of the output OFF time in a stepwise manner based on a determination result regarding the lapse of the predetermined time.

10. The injection controller of claim 1, further comprising:
a boost voltage detection unit configured to detect a boost voltage applied to the fuel injection valve at an injection start timing, wherein
the control unit compares the boost voltage detected by the boost voltage detection unit at the injection start timing with a boost voltage reference value, and performs correction on a condition that the detected boost voltage is lower than the boost voltage reference value or does not perform correction on a condition that the detected boost voltage is equal to or higher than the boost voltage reference value.

11. The injection controller of claim 1, wherein
the integrated current of the ideal current profile is $\int_{t0}^{ta}(PI)dt$,
t0 is an ideal energization start time,
ta is an ideal energization end time, and
PI is the ideal current profile.

12. The injection controller of claim 11, wherein
the integrated current of the detected current is $\int_{t0}^{ta}(EI)dt$, and
EI is a detected profile of the detected current.

13. The injection controller of claim 12, wherein
a correction amount is based on $\int_{t0}^{ta}(PKI)dt = \int_{t0}^{tb=(ta+\Delta TQ)}(EI)dt$,
tb is the corrected output OFF time of the energization instruction signal, and
$\Delta TQ$ is the correction amount.

14. The injection controller of claim 1, wherein
the integrated current of the detected current is $\int_{t0}^{ta}(EI)dt$,
t0 is an ideal energization start time,
ta is an ideal energization end time, and
EI is a detected profile of the detected current.

15. An injection controller that injects fuel from a fuel injection valve, the injection controller comprising:
a control unit configured to output an energization instruction signal for controlling the fuel injection valve; and
a current detector configured to detect an electric current flowing in the fuel injection valve,
wherein
the control unit corrects an output OFF time of the energization instruction signal based on a difference between (i) an integrated current of an ideal current profile and (ii) an integrated current of the detected current detected by the current detector,
the integrated current of the ideal current profile is a first ideal charge amount flowing into the fuel injection valve during a first continuous time period within a single ideal fuel injection cycle,
the integrated current of the ideal current profile is $\int_{t0}^{ta}(PI)dt$,
t0 is an ideal energization start time,
ta is an ideal energization end time,
PI is the ideal current profile,
the integrated current of the detected current is $\int_{t0}^{ta}(EI)dt$, and
EI is a detected profile of the detected current.

16. An injection controller that injects fuel from a fuel injection valve, the injection controller comprising:
a control unit configured to output an energization instruction signal for controlling the fuel injection valve; and
a current detector configured to detect an electric current flowing in the fuel injection valve,
wherein
the control unit corrects an output OFF time of the energization instruction signal based on a difference between (i) an integrated current of an ideal current profile and (ii) an integrated current of the detected current detected by the current detector,
the integrated current of the ideal current profile is a first ideal charge amount flowing into the fuel injection valve during a first continuous time period within a single ideal fuel injection cycle,
the integrated current of the detected current is $\int_{t0}^{ta}(EI)dt$,
t0 is an ideal energization start time,
ta is an ideal energization end time, and
EI is a detected profile of the detected current.

* * * * *